United States Patent [19]
Ouchi

[11] Patent Number: 6,046,096
[45] Date of Patent: *Apr. 4, 2000

[54] METHOD OF FABRICATING A DEVICE INCLUDING COMPOUND SEMICONDUCTOR CRYSTAL AND METHOD OF FABRICATING A COMPOUND SEMICONDUCTOR LAYER STRUCTURE

[75] Inventor: Toshihiko Ouchi, Sagamihara, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/938,447

[22] Filed: Sep. 29, 1997

[30] Foreign Application Priority Data

Sep. 30, 1996 [JP] Japan .................................. 8-278978
Aug. 11, 1997 [JP] Japan .................................. 9-228860

[51] Int. Cl.$^7$ ................................................ H01L 21/208
[52] U.S. Cl. .......................... 438/510; 438/481; 438/519; 438/514; 438/46
[58] Field of Search ................................. 438/510, 226, 438/513, 514, 515, 518, 519, 530, 46, 522, 44–45, 480–481

[56] References Cited

U.S. PATENT DOCUMENTS

| | | | |
|---|---|---|---|
| 4,378,259 | 3/1983 | Hasegawa et al. | 148/175 |
| 4,510,515 | 4/1985 | Kajita et al. | 357/17 |
| 4,735,910 | 4/1988 | Mitsuyu et al. | 438/46 |
| 4,792,467 | 12/1988 | Melas et al. | 427/255 |
| 5,057,442 | 10/1991 | Habuka | 438/46 |
| 5,168,330 | 12/1992 | Vikavage et al. | 257/280 |
| 5,373,175 | 12/1994 | Ozawa et al. | 257/99 |
| 5,383,211 | 1/1995 | Van de Walle et al. | 372/43 |
| 5,445,897 | 8/1995 | Satoh et al. | 428/688 |
| 5,456,765 | 10/1995 | Sato et al. | 148/33 |
| 5,496,766 | 3/1996 | Amano et al. | 438/29 |
| 5,597,761 | 1/1997 | Adomi et al. | 438/46 |
| 5,604,135 | 2/1997 | Edmond et al. | 438/45 |
| 5,689,123 | 11/1997 | Major et al. | 257/190 |
| 5,723,383 | 3/1998 | Kosugi et al. | 438/719 |
| 5,734,182 | 3/1998 | Nakamura et al. | 257/96 |
| 5,740,192 | 4/1998 | Hatano et al. | 257/101 |
| 5,751,026 | 5/1998 | Sato et al. | 257/190 |
| 5,753,039 | 5/1998 | Hishida et al. | 117/104 |
| 5,759,264 | 6/1998 | Watanabe et al. | 117/101 |
| 5,804,834 | 9/1998 | Shimoyama et al. | 257/22 |
| 5,856,208 | 1/1999 | Sato et al. | 438/46 |

FOREIGN PATENT DOCUMENTS 0 480 780 A1  4/1992  European Pat. Off. .

OTHER PUBLICATIONS

Weyers M et al: "Growth of GAASN Alloys by Low–Pressure Metalorganic Chemical Vapor Deposition Using Plasma–Cracked NH3" Applied Physics Letters, vol. 62, No. 12, Mar. 22, 1993, pp. 1396–1398, XP000354549.

Sato M: "Plasma–Assisted MOCVD Growth of GAAS/GAN/GAAS Thin–Layer Structures by N–AS Replacement Using N–Radicals", International Conference on Solid State Devices and Materials, Aug. 23, 1994; pp. 7–9, XP 000543870.

*Primary Examiner*—Charles Bowers
*Assistant Examiner*—Thanh Nguyen
*Attorney, Agent, or Firm*—Fitzpatrick, Cella, Harper & Scinto

[57] ABSTRACT

A method of fabricating a compound semiconductor layer structure including a layer containing nitrogen is provided. In a method of fabricating a device including a compound semiconductor layer structure, a portion of crystal of compound semiconductor, which is to be at least a portion of a function layer of the device, is irradiated with material including at least nitrogen, and element of V group of the irradiated portion is substituted by the nitrogen. In a fabrication method, a thickness of the N-substituted layer does not exceed its critical layer thickness. In a fabrication method, a depth of the N-substituted portion is controlled by using material for oppressing the substitution by nitrogen.

18 Claims, 8 Drawing Sheets

METHOD OF FABRICATING A DEVICE INCLUDING COMPOUND SEMICONDUCTOR CRYSTAL AND METHOD OF FABRICATING A COMPOUND SEMICONDUCTOR LAYER STRUCTURE

BACKGROUND OF THE INVENTION

1. Field of the Invention

The present invention relates to a method of fabricating a compound semiconductor layer structure and a method of fabricating a device including compound semiconductor crystal.

2. Description of Related Art

Presently, a semiconductor laser of a 1.3 μm band or 1.55 μm band used for optical communications is basically fabricated with InGaAsP/InP-series material. With that material series, when a heterojunction is formed, a leap appearing in its conduction band or a band offset amount $\Delta E_c$ is small. Therefore, when its temperature rises, carriers are likely to overflow readily. As a result, its thermal characteristic decreases, and degradation of the device's threshold, efficiency and the like due to the rise in temperature is a serious problem. Recently, that problem has been slightly solved by using AlGaInAs containing Al mixed crystal. That technology, however, is not satisfactory for the purpose of applying to a low-cost laser and the like which require no temperature control.

On the other hand, the development of a blue-color laser using material, into which nitrogen is introduced as V-group element, has been active. That device can also be employed as a long wavelength range laser with a small band gap when mixed crystal, whose content of nitrogen is small, is used. For example, in a single quantum well laser in which a quantum well layer of InGaAsN (its nitrogen content is 0.5%) and barrier layers of AlGaAs are formed on a GaAs substrate, laser oscillation at a wavelength of about 1.2 μm has been reported (see Kondow, et al. Pre-delivered Papers of '96 Spring Meeting of Japan Applied Physics Academy, 27p-C-6). In such a nitrogen-introduced device, since energy of a bottom of its conduction band is greatly lowered from a vacuum level, its band offset amount $\Delta E_c$ is quite large and shows a value of about 500 meV that is approximately five times as large as a value of InGaAsP-series. Therefore, in such a device, the thermal characteristic is considerably improved, and there is a possibility that the device shows a practical performance up to high temperatures without requiring any temperature control. Actually, that laser shows its characteristic temperature $T_0$=126 K that is about twice as large as a value of an ordinary InP-series laser (see Kondow, et al. Pre-delivered Papers of '96 Autumn Meeting of Japan Applied Physics Academy, 8p-KH-7).

In order to introduce nitrogen into crystal, there exists technology, so-called nitrification, that V-group element in the crystal is substituted by nitrogen by irradiating a substrate surface with nitrogen, other than an ordinary crystal growth technology in which nitrogen is supplied together with other elements during the growth (see Yamamoto, et al. Pre-delivered Papers (separate vol. 1) of Japan Applied Physics Academy, '95 Spring Meeting 28p-ZH-14 and 28p-ZH-16 and '96 Autumn Meeting 9a-ZF-3). That nitrification technology provides a substrate for growing GaN-series crystal thereon, which is primarily used in a blue light emitting device and an electronic device, and thus a GaN layer is formed on a surface of a GaAs substrate by substituting As of the GaAs substrate by N. As the nitrification condition, the substrate temperature is 900° C., a 100% gas of $NH_3$ is supplied at 3 l/min for ten (10) minutes, and a film with a depth of about 1 μm on the substrate is changed to GaN. Since GaN is formed on the GaAs substrate, a difference in lattice constants therebetween amounts to at least about 20%, and hence its crystal quality is deteriorated. Thus, no single crystal can be obtained.

Further, there is a case where only a very thin film (about 10 nm) on the surface is changed to a GaN layer (see Yao, et al. Pre-delivered Papers (separate vol. 1) of Japan Applied Physics Academy, '96 Autumn Meeting 7a-ZF-2). In that technology, a GaAs substrate is irradiated with nitrogen plasma excited by rf, and its purpose is to improve the quality of the substrate surface but not to control the amount of nitrogen for subsitution. Moreover, that technology aims at making a lattice constant of the surface film close to that of GaN of cubic system.

SUMMARY OF THE INVENTION

When InGaAsN is to be grown, its growth is performed by, for example, a metal oxide chemical vapor deposition (MOCVD) method in which nitrogen atoms plasmolyzed by high-frequency (rf) excitation are suppled as nitrogen material to a reactor and together therewith other materials, such as arsine ($AsH_3$), trimethylindium (TMI) and trimethylgallium (TEG), are also supplied to the reactor. Here, since the content of nitrogen is extremely small, the nitrogen content fluctuates due to a slight change in the substrate temperature and supply amounts of the other materials. As a result, crystal quality and optical characteristic are lowered, which leads to an increase in the threshold and the like. Further, when a heterojunction is to be fabricated, the atmosphere in a reactor needs to be finely controlled to control its interface condition. Furthermore, when the above method is used, there is a limit to the N content. Therefore, a degree of freedom in oscillation wavelength of the laser is small, and the characteristic temperature can not be improved as excellently as a theoretical value shows.

Here, the nitrogen content of InGaAsN to be used in a long wavelength range, such as about 1.3 μm, is approximately 1%, and a strict composition control is needed to form a high-quality heterojunction with its strain amount being reduced to a value below about 1%. Hence, when nitrogen is to be added after the growth is performed by a conventional nitrification method, the amount of substitution by nitrogen is too much to control the layer thickness, mole fraction, strain and the like. Thus, the surface is roughed due to evaporation of V-group element, such as As.

In a reference disclosing the above nitrification technology (Pre-delivered Papers (separate vol. 1) of Applied Physics Japan Academy, '95 Spring Meeting 28p-ZH-14 and 28p-ZH-16, '96 Autumn Meeting 9a-ZF-3 and 7a-ZF-2), its purpose is to entirely substitute As of GaAs by nitrogen, and there is no description about control of a content of nitrogen. The inventor of the present invention found that when a method of substituting element of V group in crystal by nitrogen is used as a method of forming a layer containing nitrogen, the content of nitrogen in the layer containing nitrogen can be precisely controlled. The present invention provides a method of fabricating crystal of compound semiconductor which employs a method of substituting element of V group in the crystal by nitrogen. Particularly, when a method of substituting element of V group in crystal by nitrogen, which the inventor of the present invention found, is used, the content of nitrogen in the layer containing nitrogen can be precisely controlled. Based on this point, the present invention provides a method of fabricating crystal of compound semiconductor, and a method of further improving precision of substitution of element of V group in crystal by nitrogen.

A method of fabricating a device including a layer structure of compound semiconductor according to the present invention is as follows:

A method of fabricating a device including a layer structure of compound semiconductor is characterized by a step of irradiating a portion of crystal of compound semiconductor, which is to be at least a portion of a function layer of the device, with material including at least nitrogen to substitute element of V group of the irradiated portion by the nitrogen.

In the specification, the material including at least nitrogen may be nitrogen itself or material including nitrogen as its component part.

Material to be treated by the present invention is crystal of compound semiconductor including element of V group, and especially, crystal of III–V compound semiconductor. For example, when InGaAs is irradiated with material including at least nitrogen, an InGaAsN layer can be formed.

In a function layer of a device, its composition or mole fraction is desired to be precisely controlled to control its characteristic (such as its band gap, refractive index, transition energy and gain spectrum). In the present invention, the composition of the function layer, particularly its nitrogen content, can be precisely controlled because the function layer is formed by substitution by nitrogen. As the irradiation with material including at least nitrogen, nitrogen plasmolyzed by electron cyclotron resonance (ECR) or RF only needs to be projected, for example. The degree of vacuum is preferably maintained below $10^{-4}$ Torr. Here, projection power may be about 30 W in the case of ECR, and projection power may be about 200 W in the case of RF. Those values are about one order smaller than those those of a case of GaN-series. Further, a flow of nitrogen may be about 10 sccm, which is also much smaller than that of the case of GaN-series.

The crystal of compound semiconductor prior to the irradiation with material including at least nitrogen may include nitrogen or may not include nitrogen. The content of nitrogen thereof can be compensated for or increased by the irradiation with material including at least nitrogen. Specifically, the content of nitrogen can be readily controlled by controlling its irradiation amount, duration time and substrate temperature. The content of nitrogen can be estimated in-situ by, for example, photoluminescence or RHEED. For example, a compensation amount of nitrogen at the time the layer contaning nitrogen is irradiated with material including at least nitrogen only needs to be controlled based on such estimation of the content of nitrogen. In the present invention, nitrogen can be contained in an extremely thin layer on surface and a thin layer containing nitrogen can be obtained by the irradiation with material including at least nitrogen. For example, the substitution amount of nitrogen needed in a infrared range can be sufficiently acquired, and a quantum well layer can be readily formed. According to this invention, high-quality N-series III–V compound semiconductor can be readily formed. As the function layer of the present invention, there are various layers. When the device is, for example, a laser, a nitrogen-substituted layer can be used as its active layer. Further, in a vertical cavity surface emitting laser, the refractive index of its reflector mirror for constituting its cavity needs to be set to a desired value. Since a degree of the nitrogen substitution can be preferably controlled in the present invention, it is preferable to use a nitrogen-substituted layer in the reflector mirror layer which is a function layer. Particularly, when the layer containing nitrogen is used in the mirror layer, a large difference in the refractive index can be obtained therein and its thermal characteristic can be greatly improved.

Further, when the substitution by the nitrogen is conducted down to a predetermined depth from a surface portion irradiated with material including at least nitrogen, the thickness of the layer containing nitrogen can be controlled.

Further, when the step of irradiation with material including at least nitrogen and a step of growing crystal of III–V compound semiconductor are alternately performed, N-substituted layers can be periodically formed. Hence, a multiple quantum well structure can be readily formed.

Further, a quantum well structure including a well layer with a stepwise band diagram can be formed by the substitution with nitrogen. A device having a desired characteristic can be obtained by forming a multi-step quantum well structure.

Furthermore, a method of fabricating a layer structure of compound semiconductor according to the present invention is as follows:

A method of fabricating a layer structure of compound semiconductor is characterized in that a step of irradiating crystal of compound semiconductor containing element of V group with material including at least nitrogen is conducted to substitute element of V group of the irradiated portion by the nitrogen and in that a depth of the N-substituted portion is in a range not exceeding its critical layer thickness.

The critical layer thickness is determined by a degree of strain in the N-substituted layer. For example, if a difference between lattice constants of the N-substituted layer and its substrate side ia large, strain occurs therein. If exceeding the critical layer thickness, quality of the layer is degraded due to such strain. It is preferable in this invention that the thickness of the N-substituted layer is approximately not over 10 nm.

Furthermore, another method of fabricating a layer structure of compound semiconductor according to the present invention is as follows:

A method of fabricating a layer structure of compound semiconductor is characterized in that a first layer of crystal of compound semiconductor containing element of V group and a second layer of crystal of compound semiconductor containing element of V group are formed, the second layer is irradiated with material including at least nitrogen from a side opposite to the first layer side to substitute element of V group of the irradiated portion by the nitrogen, and the first layer contains element of V group which is harder to be substituted by nitrogen than element of V group in the second layer to be substituted by the nitrogen.

In this method, there is provided a step of forming a portion containing material hard to be substituted by nitrogen under a portion to be substituted by the nitrogen. A similar step may also be provided in the above-discussed fabrication method. For example, when it is desired that the substitution by nitrogen is conducted down to a certain depth (such as a critical layer thickness, a desired thickness of a quantum well and a desired thickness of a layer of a reflector mirror) and that the substitution by nitrogen in a deeper portion needs to be oppressed, element of V group hard to be substituted by nitrogen only needs to be contained in that deeper portion. For example, when InGaAs is to be irradiated with material including at least nitrogen, a layer containing P is formed under InGaAs. Hence, a process of the substitution by nitrogen beyond a desired region can be depressed because phosphorus is harder to be substituted than As.

In the above-discussed present invention, an indispensable element is to perform the substitution by nitrogen by irradiating an object with material including at least nitrogen, and a degree of that N-substitution can be preferably controlled. Therefore, the present invention is preferably applicable when a portion of element of V group contained in a portion irradiated with material including at least nitrogen is to be substituted by nitrogen. Specifically, the substitution by the nitrogen is conducted by substituting not over about 20% of the element of V group by the nitrogen, or the substitution by the nitrogen is conducted such that a strain amount of the portion, whose V-group element is substituted by the nitrogen, is not over about several % (more preferably, not more than 1%). Those cases are especially preferable, and quality of the layer (single-crystal quality, rareness of roughness on its surface, and the like) can also be maintained at a desirable level. When the layer is used as an active layer, it is especially important to maintain the layer quality at a preferable level. Further, when regrowth is conducted on the N-substituted layer, it is also important to maintain the layer quality at a preferable level.

Further, the irradiation with the material including at least nitrogen may be irradiation with one of nitrogen plasma and ammonia gas. The nitrogen plasma is initially-activated nitrogen. Regarding material containing nitrogen, such as the annmonia gas, activated nitrogen is generated when the material is readily thermally decomposed after projected on the substrate.

Further, the irradiation with the material including at least nitrogen may be irradiation with this material and element of V group contained in the irradiated portion. Furthermore, the irradiated portion may be simultaneously irradiated with material including at least nitrogen and material including at least element of V group contained in the irradiated portion.

Further, a step of growing crystal of compound semiconductor (an heteroepitaxial growth of III–V compound semiconductor) may be performed after the irradiation step with the material including at least nitrogen. In the step of growing crystal of compound semiconductor other than the step of irradiation with the material including at least nitrogen, it is desirable to stop the supply of the material including at least nitrogen. It is also desirable to continuously perform the growth of crystal of compound semiconductor and the step of irradiation with the material including at least nitrogen, in a crystal growth chamber into which a gas source can be introduced.

Further, the layer grown after the step of irradiation with the material including at least nitrogen may have a strain opposite to the strain of the N-substituted portion. Thereby, the strain of the N-substituted portion can be relaxed. When a plurality of N-substituted layers are to be formed as a multiple quantum well structure, a large number of the N-substituted layers can be provided due to the relaxation of the strain.

Further, when an uneven surface is formed on a portion to be irradiated with the material including at least nitrogen and the uneven surface is irradiated with the material including at least nitrogen, the substitution occurs more readily on a recess portion of the uneven surface where bond potential is low. Therefore, N-series III–V semiconductor can be selectively formed. Thus, a fine structure, such as a quantum wire structure, can be readily formed.

Further, when the function layer is the N-substituted layerformed by the above method, a device with a precisely-formed function layer, such as a semiconductor laser, can be achieved. This semiconductor laser also has an excellent thermal characteristic.

Further, when a quantum well structure with the stepwise band diagram is formed, devices, such as a semiconductor laser with an excellent high-speed characteristic, can be built.

Further, improved characteristics, such as low threshold, can be achieved by a device with a quantum well structure. The quantum well structure can be formed into a multiple quantum well structure. The threshold of a semiconductor laser can be further lowered by introducing a quantum wire structure thereinto.

Further, when a GaAs substrate is used, InGaAsN is formed as a well layer by nitrifying InGaAs by the above method and GaAs is used as a barrier layer, a laser in a 1.3 $\mu$m–1.55 $\mu$m band with excellent thermal characteristic, which is especially suitable for communications, can be obtained.

Further, GaInAsN/AlAs fabricated by the above method may be used as a multi-layer (epitaxial) mirror in a vertical cavity surface emitting laser, in place of GaAs/AlAs. Thereby, a refractive-index difference and thermal characteristic thereof can be improved.

Furthermore, a laser fabricated according to the present invention and a control circuit for modulating its output light can constitute an optical transmitter for outputting an optical signal. The laser may be directly modulated by the control circuit. Specifically, current modulated in accordance with a transmission signal only needs to be supplied to the laser under a condition under which a predetermined current or voltage is applied thereto.

Further, a photodetector can be fabricated by the above method.

Each of the laser and photodetector of the present invention can have at least one characteristic of excellent thermal characteristic, excellent high-speed response and high efficiency. Therefore, optical transmitters and receivers with good qualities can be realized by using those devices. Optical communication systems with practicality and excellent quality can also be built by using those devices.

These advantages and others will be more readily understood in connection with the following detailed description of the preferred embodiments in conjunction with the drawings.

DESCRIPTION OF THE PREFERRED EMBODIMENTS

Embodiments having specific structures will be described hereinafter.

First Embodiment

Figure 1:
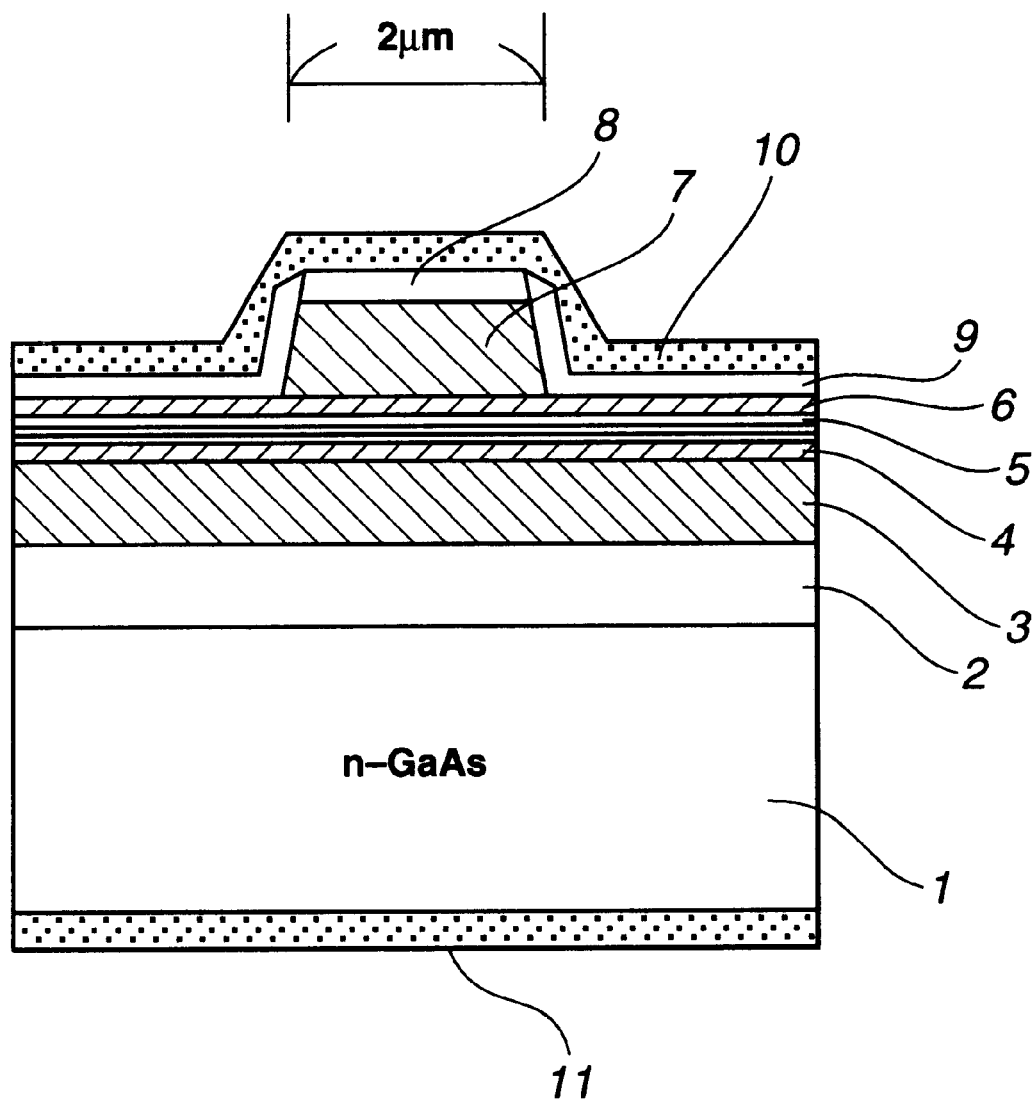
FIG. 1 is a cross-sectional view taken along a lateral direction of a ridge-type laser of a first embodiment of the present invention.

FIG. 1 illustrates an example of a laser wafer structure fabricated by a first embodiment of a fabrication method of the present invention. FIG. 1 is a cross-sectional view in a direction perpendicular to its cavity direction. In the first embodiment, an n-GaAs buffer layer 2 having a thickness of 1 $\mu$m, an n-InGaP clad layer 3 which is lattice-matched and whose thickness is 1 $\mu$, an undoped GaAs separate carrier and optical confinement heterostructure (SCH) layer 4 having a thickness of 50 nm, and a compressively-strained undoped InGaAs layer (its In content and Ga content are respectively 15% and 85%) having a thickness of 5 nm are initially grown on an n-GaAs substrate 1 by a chemical beam epitaxy (CBE) method. Here, arsine ($AsH_3$) and phosphine ($PH_3$), which are thermally decomposed at 900° C., are used as elements of V group, and trimethylindium (TMI) and trimethylgallium (TEG) are used as III-group elements, and the growth temperature is set to 550° C. After that, the substrate temperature is maintained at 800° C., and the substrate is irradiated with arsine and nitrogen plasmolyzed by ECR. During the irradiation, flows of arsine and nitrogen are respectively set to 0.1 sccm and 10 sccm, and those values are maintained for ten (10) minutes. The projection power of ECR and a degree of vacuum may be respectively 30 W and about $5\times10^{-5}$ Torr. Thereby, the compressively-strained undoped InGaAs layer having a thickness of 5 nm is nitrification-processed and changed to InGaAsN.

When radiation peak wavelengths are compared between InGaAs subjected to no nitrogen irradiation and InGaAsN formed by the process of the present invention, by using photoluminescence (PL), this comparison reveals that the peak wavelength of the latter subjected to the nitrification process is shifted to a longer wavelength, for example, 1.3 $\mu$m, while the peak wavelength of the former remains unchanged, i.e., 1.1 $\mu$m. That is attributable to the fact that a portion of As in InGaAs is substituted by N. Thus, that structure can be used as an active layer in a laser whose oscillation wavelength is in a 1.3 $\mu$m band. The substitution amount of N is estimated at about 1% from a lattice constant estimated by an X-ray diffraction and a PL wavelength.

Turning back to FIG. 1, after that nitrification process, an undoped GaAs barrier layer with a thickness of 10 nm and an undoped InGaAs layer with a thickness of 5 nm are grown. Similarly, the nitrification process is again performed to form another InGaAsN layer. Such processes are repeated five times to form an active layer 5 with five well layers. After the fifth InGaAsN layer is formed, an undoped GaAs SCH layer 6 with a thickness of 50 nm, a p-InGaP clad layer 7 with a thickness of 1 $\mu$m and a p-GaAs contact layer 8 with a thickness of 0.3 $\mu$m are formed. Thereby, there can be obtained a laser structure as illustrated in FIG. 1 which has such a deep well structure that carriers would not readily overflow therefrom even if its temperature increases.

The thus-grown wafer is shaped into a ridge type with a waveguide width of 2 $\mu$m as illustrated in FIG. 1, and this is evaluated as a laser with a cavity length of 300 $\mu$m. Its threshold during continuous operation at room temperature is approximately 20 mA, and its characteristic temperature $T_0$ of 150 K can be obtained when the characteristic temperature $T_0$ is measured during its pulsative operation. As the characteristic temperature $T_0$ increases, an amount of a change in the threshold relative to an increase in temperature decreases. That value is notably excellent, compared with an average value of 60 K in a conventional InGaAsP/InP-series device. Therefore, the quality of the grown layer and the like can be improved and the threshold can be lowered by optimizing conditions of the nitrification process, the current confinement structure and the like (for example, in the above case, conditions of the arsine flow, N flow, and substrate temperature). Hence, the device can be used as a laser for communications which can be driven free from temperature control.

In the above embodiment, though the nitrification processing of the surface of the InGaAs layer is performed, it is possible that after GaInNAs is grown by supplying N also during the growth time, its nitrogen content is evaluated in-situ and then the above nitrification process is performed. In this case, the band diagram of anactive layer is similar to that of the device of FIG. 1, and the layer subjected to the nitrification process is a layer which constitutes the deepest ground level of all the well layers or which primarily contributes to laser oscillation. Therefore, characteristics of a laser can be improved by introducing the layer subjected to the nitrification process thereinto.

In FIG. 1, reference numeral 9 denotes an insulating layer, and reference numerals 10 and 11 respectively denote n-side and p-side electrodes. The device of this embodiment is described as a Fabry-Perot structure, but the device can be constructed as a distributed feedback (DFB) laser by forming a diffraction grating therein.

Second Embodiment

Figure 2:
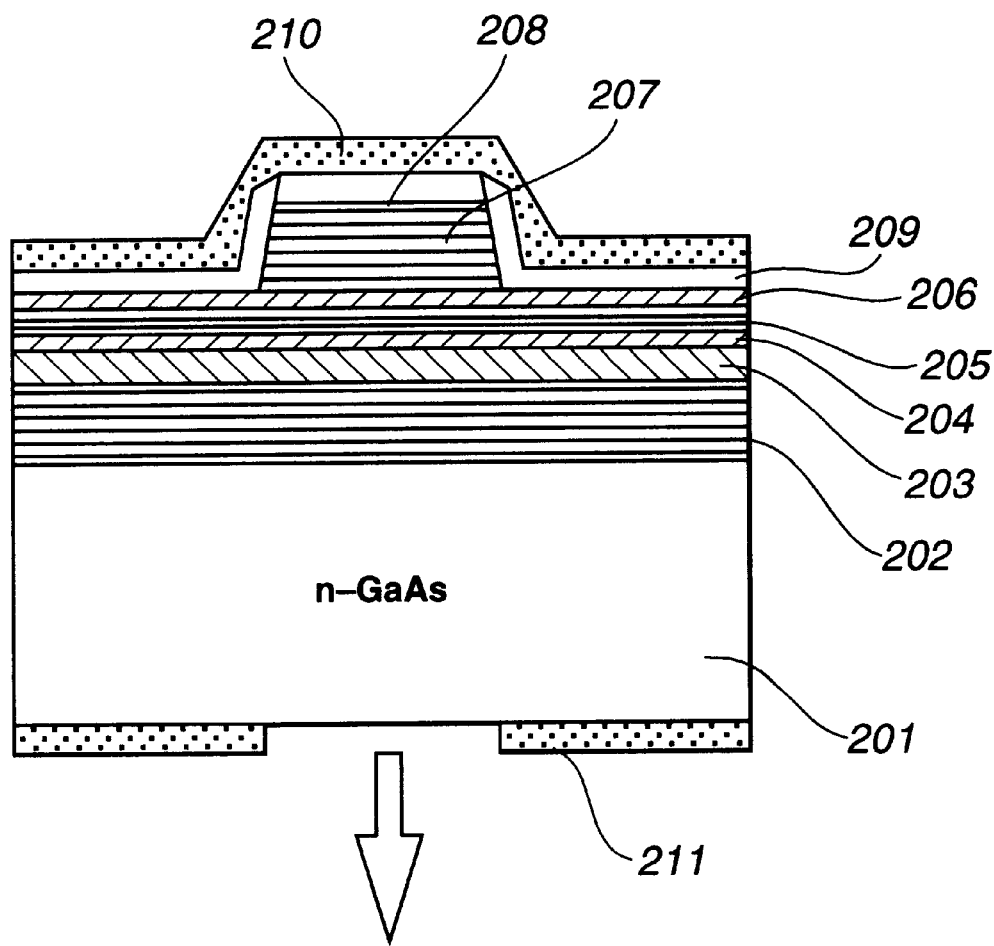
FIG. 2 is a cross-sectional view of a vertical cavity surface emitting laser of a second embodiment of the present invention.

In the first embodiment, the device is operated as an edge-emitting laser, but a device can be operated as a vertical cavity surface emitting laser as illustrated in FIG. 2 by forming a similar layer structure around its active layer. The structure of a second embodiment will be described.

In FIG. 2, a distributed reflector mirror 202 consisting of twenty (20) pairs of n-GaAs/AlAs (a thickness of each film is $\lambda/4$), an n-lnGaP clad layer 203, a GaAs spacer layer 204, a MQW active layer (ten wells) 205 composed of an InGaAsN/GaAs multi-layer similar to that of FIG. 1, a GaAs spacer layer 206, a distributed reflector mirror 207 consisting of thirty (30) pairs of p-GaAs/AlAs (a thickness of each film is $\lambda/4$), and a p-GaAs contact layer 208 are grown on an n-GaAs substrate 201 by a method of the present invention.

Here, since the thickness of each well layer (ten wells) in the active layer 205 is large, there may be a case where the thickness reaches a critical layer thickness due to strain of InGaAsN. In this case, it is possible that the barrier layer is formed of an InGaAsP layer and a strain opposite to the strain of the well layer is introduced into the barrier layer to establish an active layer of a strain compensation type. Here, when P is contained in crystal, the crystal acts as a stopper layer for preventing the nitrification from advancing beyond a design value in its depth direction. That action is attributable to the fact that the substitution of P by N is a process requiring large energy, while the substitution of As by N is advanced thermodynamically stably.

The GaAs spacer layers 204 and 206 are provided for adjustment of a length of the cavity, injected current and so forth, and are made of material transparent to light. The distributed reflector mirror 207 and the contact layer 208 above the active layer 205 are shaped into a circular pattern with a diameter of 10 μm, and a short cavity is formed by the reflector mirrors 202 and 207. Oscillation light is picked out of the side of the substrate 201. For that purpose, the bottom surface of the substrate 201 is polished to be a specular surface.

In FIG. 2, reference numeral 209 denotes an insulating layer, reference numeral 210 denotes an electrode formed on the contact layer 208, and reference numeral 211 denotes an annular electrode formed on a lower surface of the substrate 201 through whose central opening the oscillation light is taken out.

Since the cavity is short in such a structure, a very low threshold can be obtained by optimizing the structure. Conventionally, when such a vertical cavity surface emitting laser is to be oscillated in a 1.3 μm band, its oscillation characteristic at high temperatures is extremely poor and the device is impractical, because the temperature characteristic of InGaAsP/InP-series crystal is low. According to the present invention, a vertical cavity surface emitting laser in a wavelength range for communications can be put into a practical use.

Further, in the case of a vertical cavity surface emitting laser, the present invention can be applied to a reflector mirror constituting its cavity. For example, a multi-mirror can be obtained by alternately layering AlAs and GaInAsN formed by the substitution by nitrogen. Its thermal characteristic can be greatly improved by adopting such a structure.

In the first and second embodiments, InGaAsN is fabricated by nitrifying InGaAs, since a device in a 1.3 μm band is purported. However, other III–V semiconductors can be used. In this case, In, Ga and Al can be used as III-group element, Sb, As and P can be used as element of V group, and the element of V group is partly substituted by N by the nitrification process. Thus, a semiconductor film, whose energy band gap varies in a wide range, can be formed. Thereby, a similar fabrication method can be employed in varous wavelength ranges.

Third Embodiment

Figure 3:
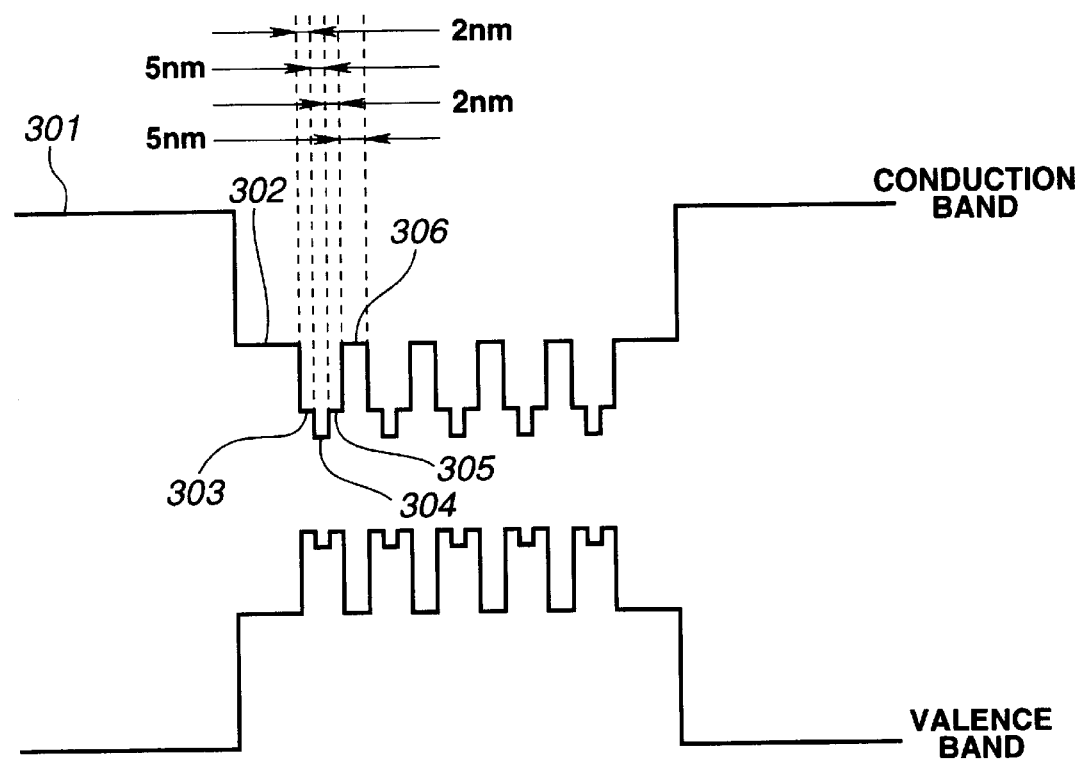
FIG. 3 is a view illustrating an example of the band structure of an active layer in a third embodiment fabricated using a fabrication method of the present invention.

A third embodiment is directed to a fabrication method of semiconductor according to the present invention, in which a simple fabrication of a nitride semiconductor is used and the band structure of a quantum well can be flexibly set, similarly to the first and second embodiments. An example of the band structure of layers around an active layer is illustrated in FIG. 3.

The laser structure differs from the first and second embodiments merely in the structure of the active layer. That is, after an InGaAs well layer with a thickness of 7 nm is grown, a nitrification process similar to that of the first and second embodiments is performed to lower a level of its conduction band. However, the InGaAs well layer is only nitrified to a depth of 5 nm from its surface to form InGaAsN 304, and remaining InGaAs 303 with a thickness of 2 nm remains unchaged. After such a process, growths of InGaAs 305 with a thickness of 2 nm, GaAs barrier layer 306 with a thickness of 5 nm and InGaAs well layer with a thickness of 7 nm, and the nitrification process to a depth of 5 nm are repeated to form a five-well active layer having a stepwise well structure as illustrated in FIG. 3. In FIG. 3, reference numeral 301 denotes a clad layer and reference numeral 302 denotes a SCH layer.

In such a structure, it can be expected to improve its quantum capture probability of carriers into a well structure in which a high-energy side of its conduction band is relatively wide and a low-energy side of its conduction band is narrow. Thus, a semiconductor laser, which is able to perform high-speed modulation and is excellent in high response, can be provided.

Fourth Embodiment

A fourth embodiment is directed to another example of a band structure fabricated by a fabrication method similar to the above method.

Figure 4:
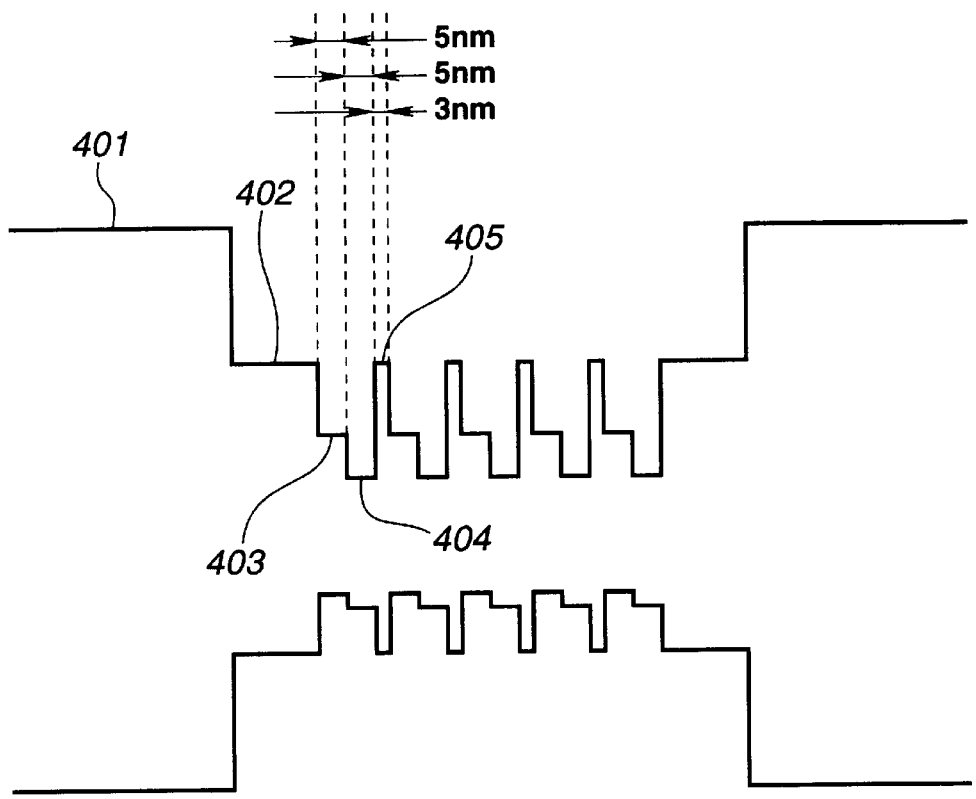
FIG. 4 is a view illustrating an example of the band structure of an active layer in a fourth embodiment fabricated using a fabrication method of the present invention.

After a thick InGaAs well layer with a thickness of 10 nm is grown and a nitrification process of this layer is performed, an InGaAs layer 403 with a thickness of 5 nm and an InGaAsN layer 404 with a thickness of 5 nm are obtained. Then, a thin GaAs-barrier layer 405 with a thickness of 3 nm is formed, and hence a structure as illustrated in FIG. 4 is obtained. In FIG. 4, reference numeral 401 denotes a clad layer and reference numeral 402 denotes a SCH layer.

In such a structure, since the barrier layer 405 is so thin that the device can function as a high-speed optical device which uses the tunnel effect of electrons. For example, the device can function as a superhigh-speed photodetector by applying a reverse electric field thereto. Further, when high-speed moulation carriers are injected into the device to which a reverse electric field is applied, population inversion is created between ground and first quantum well levels in its quantum well due to the tunnel phenomenon of electrons. Hence, a superhigh-speed modulation of a semiconductor laser can be performed by using the inter-subband transition of electrons.

Thus, a structure with a similar stepwise band diagram can be readily fabricated by controlling the condition of the nitrification process, the composition of compound semiconductor, its thickness and so forth.

Fifth Embodiment

Figure 5:
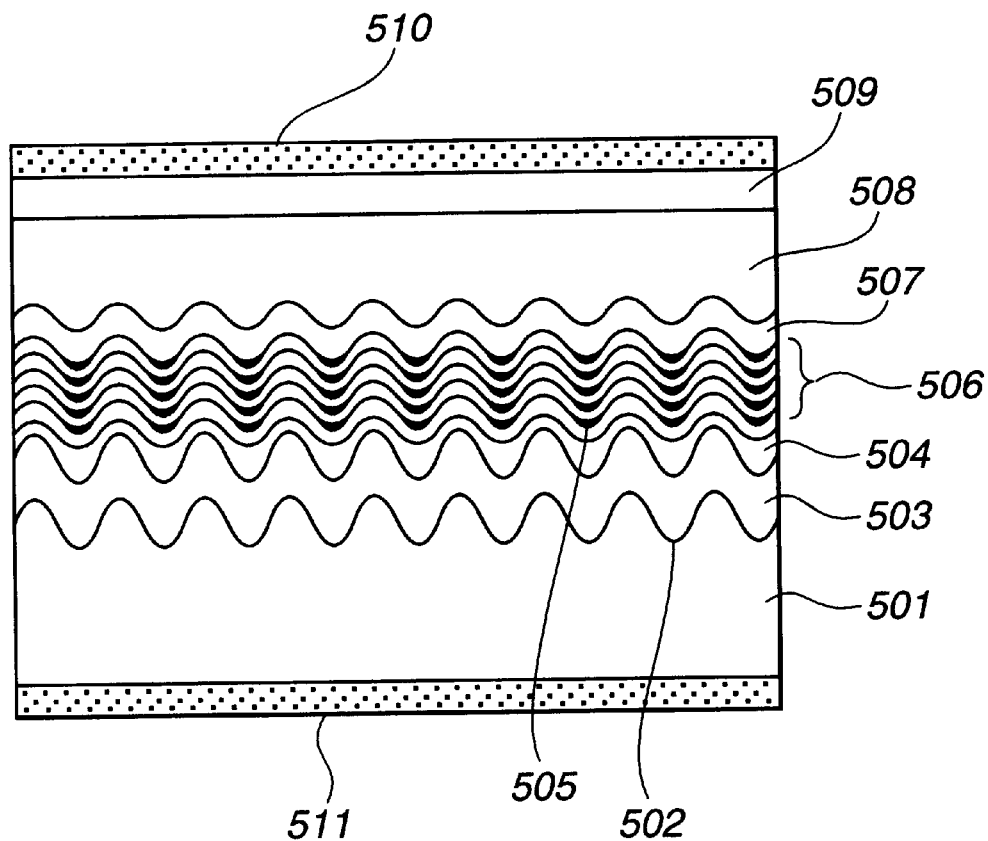
FIG. 5 is a cross-sectional view taken along a longitudinal direction of a quantum wire laser of a fifth embodiment of the present invention.

A fifth embodiment is directed to a fabrication method of fabricating InGaAsN in the form of a quantum wire structure by forming an uneven face on a GaAs substrate and growing a quantum well that reflects this unevenness as illustrated in FIG. 5.

FIG. 5 is a cross-sectional view of a ridge portion taken along a cavity direction. A grating 502 with a depth of 100 nm and a pitch of 200 nm is formed on a GaAs substrate 501, and an InGaP clad layer 503, a GaAs SCH layer 504 and an InGaAs well layer are grown similarly to the first embodiment. In the well layer, there is an uneven shape though the depth of the diffraction grating is slightly reduced. Therefore, when a nitrification process is performed, the nitrification is advanced around a recess portion since the bond potential is low in the recess portion. As a result, a large number of InGaAsN quantum wires 505 with a width of about 10 nm and a low quantum level can be formed along the recess portion. A multiple quantum wire active layer 506 can be fabricated by laying down a plurality of layers of those quantum wires 505 as is performed in the first embodiment. In FIG. 5, reference numeral 507 denotes a GaAs SCH layer, reference numeral 508 denotes an InGaP clad layer, reference numeral 509 denotes a contact layer, and reference numerals 510 and 511 respectively denote electrodes. In such a device, oscillation in a single longitudinal mode can be effected similarly to the operation of an ordinary DFB laser.

The laser structure may be a vertical cavity surface emitting type as described in the second embodiment. In this case, the uneven shape performs no distributed feedback operation of light.

Thus, a low-threshold laser-capable of high-speed operation and the like can be achieved by employing that quantum wire structure.

Sixth Embodiment

Figure 6:
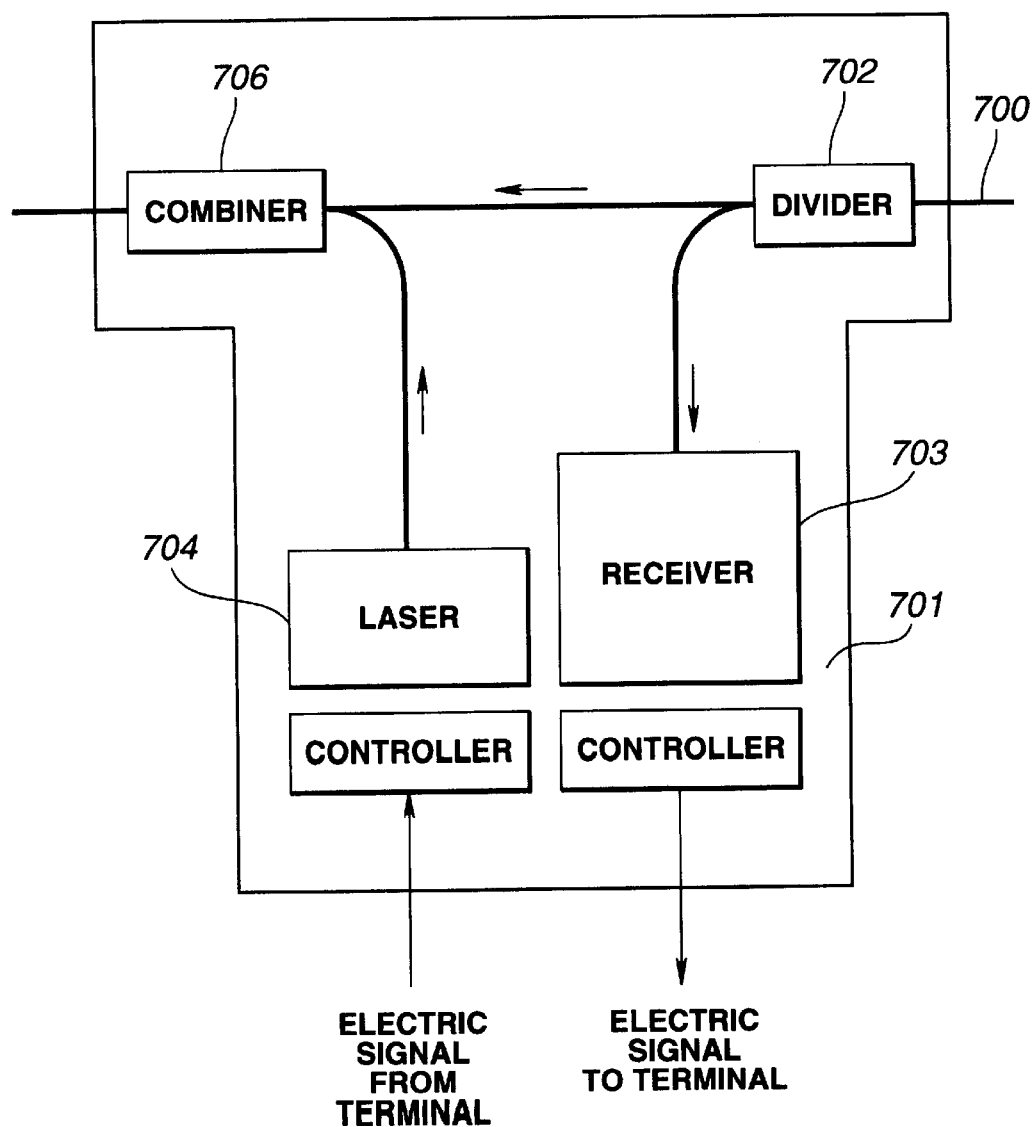
FIG. 6 is a schematic block diagram illustrating the structure of a node in a system of FIG. 7 or FIG. 8.

A sixth embodiment will be described with reference to FIGS. 6, 7 and 8. The sixth embodiment is directed to an optical local area network (LAN) system using an optical semiconductor device of the present invention. FIG. 6 illustrates an opto-electric converting unit (node), which is connected to a terminal in the optical LAN system shown in FIG. 7 or 8.

Figure 7:
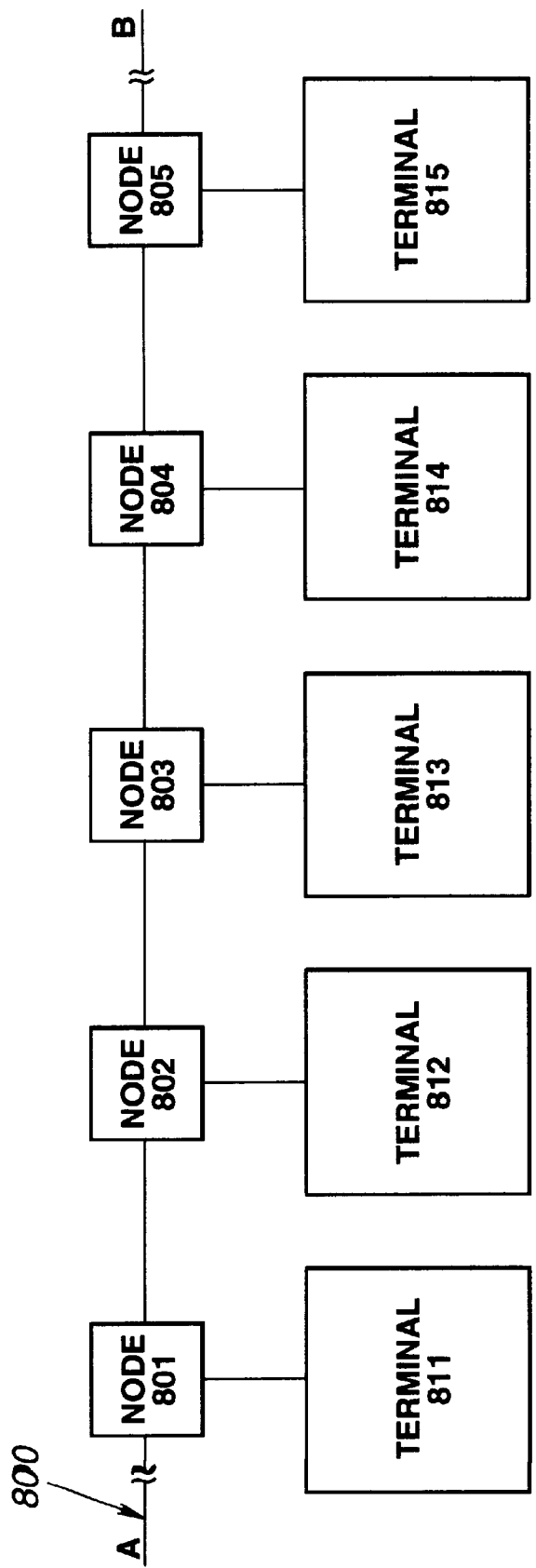
FIG. 7 is a schematic block diagram illustrating the structure of a bus-type optical LAN system using an optical semiconductor device of the present invention.
Figure 8:
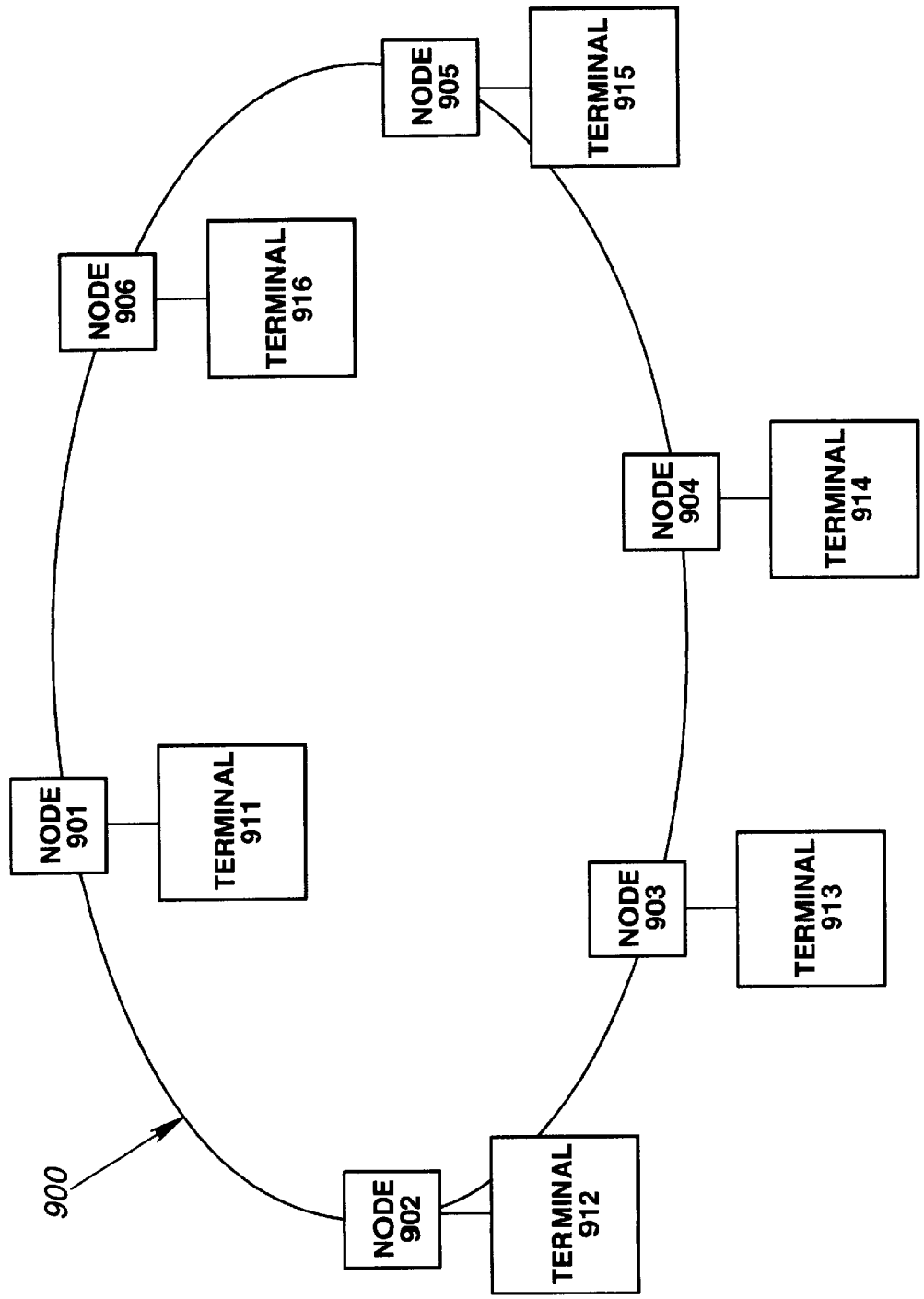
FIG. 8 is a schematic block diagram illustrating the structure of a loop-type optical LAN system using an optical semiconductor device of the present invention.

In the bus-type network shown in FIG. 7, a number of terminals 811, 812, . . . , and 815 are respectively connected to an optical fiber 800 through nodes 801, 802, . . . , and 805 along a direction A–B. At some places on the optical fiber 800, optical amplifiers (not shown) are serially connected to compensate for attenuation of transmitted signal light.

In FIG. 6, a light signal is taken into a node 701 through an optical fiber 700, and a portion of the signal is input into an optical receiver 703 by a divider or branching device 702. The optical receiver 703 includes a tunable optical filter and a photodetector, and only signal light at a desired wavelength is selected out from the incident signal light, and the signal is detected. The thus-detected signal is processed by a control circuit to be supplied to the terminal. The device of the fourth embodiment may be used as the photodetector in the receiver 703.

On the other hand, when a light signal is transmitted from the node 701, a semiconductor laser 704 of the above embodiment is appropriately driven by a control circuit according to a signal to be transmitted. Thus, output light of an amplitude-modulated signal is input into the light transmission line 700 through a combining portion 706.

A plurality of tunable optical filters and semiconductor lasers may be arranged in a node to widen the wavelength changeable range. Further, two nodes may be connected to each terminal and two optical fibers may be provided to accomplish bi-directional transmission of a DQDB system.

As a network, a loop type (see FIG. 8), which is constructed by connecting A and B in FIG. 7, a star type, or a compound configuration thereof may be used. In FIG. 8, reference numeral 900 denotes a light transmission line, reference numerals 901 to 906 respectively denote optical nodes and reference numerals 911 to 916 respectively denote terminals.

As described in the foregoing, the following technical advantages can be obtained by the present invention.

There is no need to precisely control a flow of nitrogen during a growth process of crystal. Further, there can be provided a method of fabricating a heteroepitaxial layer comprised of a III–V semiconductor layer containing nitrogen, an optical semiconductor device, such as a semiconductor laser, which uses a III–V semiconductor layer containing nitrogen as an active layer and is excellent in its thermal characteristic, and an optical semiconductor device, such as a semiconductor laser, which uses a III–V semiconductor layer containing nitrogen as an active layer and is excellent in its high-speed response.

Further, when substitution by nitrogen is selectively conducted and a semiconductor layer containing nitrogen and a layer without nitrogen are formed in a distributed pattern, a fine structure, such as a quantum wire, can be readily fabricated. Further, there can be provided an optical semiconductor device, such as a semiconductor laser, which uses a quantum wire made of III–V semiconductor containing nitrogen as an active layer and is excellent in its efficiency, and a semiconductor laser in a 1.3 $\mu$m–1.55 $\mu$m band for communications which is excellent in its thermal characteristic.

Moreover, there can be provided an optical transmitter and an optical transceiver each of which uses a device of the present invention and stably operates at high speed, and an optical communication system and a communication method each of which uses a device of the present invention and stably performs optical communication at high speed.

Except as otherwise disclosed herein, the various components shown in outline or block form in any of the FIGS. 1–8 are individually well known in the optical semiconductor device, fabrication method therefor and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A method of fabricating a semiconductor device comprising the steps of:

epitaxially depositing a single-crystal compound semiconductive layer containing a Group V element and no nitrogen on a substrate;

discontinuing performance of said epitaxially-depositing step;

forming a nitrogen-containing layer on a part of the surface of the semiconductive layer by irradiating a surface of the semiconductive layer with a material containing at least nitrogen and substituting only a part of a Group V element in the semiconductive layer by nitrogen while discontinuing performance of said epitaxially-depositing step, wherein the semiconductive layer maintains single-crystal quality, after substitution of nitrogen.

2. A method according to claim 1, wherein nitrogen is substituted for 20% or less of the Group V element in the semiconductive layer in said irradiating step.

3. A method according to claim 1, wherein the distortion formed in the semiconductive layer during the substitution of nitrogen is 1% or less.

4. A method according to claim 1, wherein nitrogen is substituted in a part in the thickness direction of the semiconductive layer.

5. A method according to claim 1, wherein the nitrogen-containing material comprises plasma nitrogen gas or plasma ammonia gas.

6. A method according to claim 1, wherein the semiconductive layer is simultaneously irradiated with the nitrogen-containing material and a group V element in said irradiating step.

7. A method according to claim 1, further comprising the step of epitaxially depositing another single-crystal compound semiconductive layer containing a Group V element on the first semiconductive layer, after said irradiating step.

8. A method according to claim 1, wherein said epitaxially-depositing step and said irradiating step are repeated alternately a plurality of times.

9. A method according to claim 1, wherein a quantum well structure comprising a stepwise band diagram well layer is formed by the nitrogen substitution.

10. A method according to claim 1, further comprising the step of forming surface unevenness on the semiconductive layer prior to said irradiating step so that the nitrogen content in indented portions of the unevenness is higher than that in protruded sections, after substitution of nitrogen.

11. A method of fabricating a compound semiconductor layered structure comprising the steps of:

epitaxially depositing a first layer comprising a single-crystal compound semiconductor containing a Group V element and no nitrogen onto a substrate;

epitaxially depositing a second layer comprising a single-crystal containing no nitrogen and a Group V element different from the Group V element contained in the first layer onto the first layer; and then after the first layer and the second layer are grown in said epitaxially-depositing steps, irradiating a surface of the second layer with a material containing at least nitrogen and substituting only a part of the Group V element in the second layer by nitrogen, wherein the second layer maintains single-crystal quality after substitution of nitrogen, the Group V element contained in the first layer having more difficulty in being substituted by nitrogen than the Group V element contained in the second layer, nitrogen being substituted only for the second layer.

12. A method according to claim 11, wherein nitrogen is substituted for 20% or less of the Group V element in the second layer in said irradiating step.

13. A method according to claim 11, wherein the distortion formed in the second layer during the substitution of nitrogen is 1% or less.

14. A method according to claim 11, wherein nitrogen is substituted in a part in the thickness direction of the second layer.

15. A method according to claim 11, wherein the nitrogen-containing material comprises plasma nitrogen gas or plasma ammonia gas.

16. A method according to claim 11, wherein the second layer is simultaneously irradiated with the nitrogen-containing material and a group V element in said irradiating step.

17. A method according to claim 11, further comprising the step of epitaxially depositing a third layer comprising a single-crystal compound semiconductor containing a Group V element on the second semiconductive layer, after said irradiating step.

18. A method according to claim 11, further comprising the step of forming surface unevenness on the second layer prior to said irradiating step so that the nitrogen content in indented portions of the unevenness is higher than that in protruded sections, after substitution of nitrogen.

* * * * *

UNITED STATES PATENT AND TRADEMARK OFFICE
CERTIFICATE OF CORRECTION

PATENT NO.    : 6,046,096
DATED         : April 4, 2000
INVENTOR(S)   : TOSHIHIKO OUCHI It is certified that error appears in the above-identified patent and that said Letters Patent is hereby corrected as shown below:

COLUMN 1:

Line 18, "condunction" should read --conduction--.

COLUMN 2:

Line 36, "can not" should read --cannot--.

COLUMN 3:

Line 35, "those those" should read --those--; and
   Line 57, "a infrared" should read --an infrared--.

COLUMN 4:

Line 35, "ia" should read --is--.

COLUMN 6:

Line 2, "layerformed" should read --layer formed--.

COLUMN 7:

Line 19, "1 $\mu$," should read --1 $\mu$m,--.

COLUMN 8:

Line 22, "anactive" should read --an active--.

UNITED STATES PATENT AND TRADEMARK OFFICE
CERTIFICATE OF CORRECTION

PATENT NO.   : 6,046,096
DATED        : April 4, 2000
INVENTOR(S)  : TOSHIHIKO OUCHI It is certified that error appears in the above-identified patent and that said Letters Patent is hereby corrected as shown below:

COLUMN 9:

Line 57, "unchaged." should read --unchanged.--.

COLUMN 10:

Line 15, "GaAs-" should read --GaAs--; and
   Line 21, "that" should be deleted.

COLUMN 11:

Line 3,  "laser-" should read --laser--.

Signed and Sealed this

Fifteenth Day of May, 2001

*Attest:*

NICHOLAS P. GODICI

*Attesting Officer*   *Acting Director of the United States Patent and Trademark Office*